(12) United States Patent
Zhu (10) Patent No.: US 12,199,078 B2
(45) Date of Patent: Jan. 14, 2025

(54) ULTRA-HIGH-RESOLUTION MICRO-DISPLAY SCREEN AND MANUFACTURING PROCESS THEREFOR

(71) Applicant: SUZHOU ULTIVIEW TECHNOLOGY CO., LTD., Suzhou (CN)

(72) Inventor: Tao Zhu, Suzhou (CN)

(73) Assignee: SUZHOU ULTIVIEW TECHNOLOGY CO., LTD., Suzhou (CN)

( * ) Notice: Subject to any disclaimer, the term of this patent is extended or adjusted under 35 U.S.C. 154(b) by 443 days.

(21) Appl. No.: 17/774,576

(22) PCT Filed: Nov. 19, 2019

(86) PCT No.: PCT/CN2019/119419
§ 371 (c)(1),
(2) Date: May 5, 2022

(87) PCT Pub. No.: WO2021/088125
PCT Pub. Date: May 14, 2021

(65) Prior Publication Data
US 2022/0392875 A1    Dec. 8, 2022

(30) Foreign Application Priority Data
Nov. 6, 2019   (CN) .......................... 201911074409.7

(51) Int. Cl.
*H01L 25/075*   (2006.01)
*H01L 33/00*    (2010.01)
*H01L 33/62*    (2010.01)

(52) U.S. Cl.
CPC ........ *H01L 25/0753* (2013.01); *H01L 33/005* (2013.01); *H01L 33/62* (2013.01); *H01L 2933/0066* (2013.01)

(58) Field of Classification Search
None
See application file for complete search history.

(56) References Cited

U.S. PATENT DOCUMENTS

2002/0078559 A1   6/2002  Buchwalter et al.
2013/0050227 A1   2/2013  Petersen et al.
(Continued)

FOREIGN PATENT DOCUMENTS

CN   107799545 A    3/2018
CN   108682312 A   10/2018
(Continued)

OTHER PUBLICATIONS

International Search Report and Written Opinion from International Application No. PCT/CN2019/119419 mailed Jul. 29, 2020.

*Primary Examiner* — Michael Lebentritt
(74) *Attorney, Agent, or Firm* — Dorsey & Whitney LLP (57) ABSTRACT

An ultra-high-resolution micro-display screen and a manufacturing process therefor. In the process, multiple LED light-emitting structures are formed by means of pre-arranging isolation columns and a conductive solder on a drive backplate, performing alignment-free pressing on the driving backplate (10) and an LED epitaxial wafer, and performing exposure and development on the LED epitaxial wafer. According to the method, accurate alignment does not need to be performed, and there are few pixel defects. LED units of a micro-display screen are embedded into the conductive solder, such that a high soldering adhesion is achieved, and the reliability and stability of the display screen can be improved.

19 Claims, 6 Drawing Sheets

(56) References Cited

U.S. PATENT DOCUMENTS

| | | | | |
|---|---|---|---|---|
| 2023/0117132 A1* | 4/2023 | Zhang | ................... | H01L 24/13 |
| | | | | 257/91 |
| 2023/0213817 A1* | 7/2023 | Hu | ................... | G02F 1/133603 |
| | | | | 362/97.2 |
| 2023/0420625 A1* | 12/2023 | Zhao | ................... | H01L 25/167 |

FOREIGN PATENT DOCUMENTS

| | | | | | |
|---|---|---|---|---|---|
| CN | 108997425 | A | | 12/2018 | |
| CN | 109065689 | A | | 12/2018 | |
| CN | 109148676 | A | | 1/2019 | |
| CN | 116913892 | A * | 10/2023 | ............ | H01L 24/08 |
| CN | 118039547 | A * | 5/2024 | | |
| WO | WO-2024045426 | A1 * | 3/2024 | ....... | H01L 21/67144 |

\* cited by examiner

FIG. 14

ULTRA-HIGH-RESOLUTION MICRO-DISPLAY SCREEN AND MANUFACTURING PROCESS THEREFOR

TECHNICAL FIELD

The present disclosure relates to the field of micro-display technologies, and in particular, to a Micro-LED screen and a manufacturing process therefor.

BACKGROUND

With the rapid development of a virtual reality/augmented reality (VR/AR) industry, display chips suitable for VR/AR have ushered in a period of rapid growth. Since VR/AR systems are currently mostly implemented by head-mounted devices, display suitable for such devices has to be micro-display chips, generally within 1 inch diagonally, mostly within a range from 0.6 inches to 0.7 inches. At present, the micro-display chips include LCOS, Micro-OLED and micro-LED chips. However, in the face of an AR application, the brightness of the LCOS and Micro-OLED chips is still difficult to meet actual requirements. Therefore, the display chips suitable for the AR systems may mainly be Micro-LED micro-display chips. Micro-LED is an LED miniaturization technology, which is a technology of addressing and massively transferring conventional LEDs after array and miniaturization to a circuit substrate to form ultra-small-spacing LEDs, and further miniaturizing a length of a millimeter-level LED to a micron level, so as to achieve ultra-high pixels and ultra-high resolution and theoretically adapt to screens of various sizes.

In the prior art, an implementation method of Micro-LED micro-display includes two technical routes: mass transfer and flip-chip bonding. However, mass transfer and flip-chip bonding have low yield at present, and thus cannot meet requirements of mass production of the Micro-LED micro-display chips. In addition, at present, AM driving circuits manufactured on an Si wafer substrate are mostly used in Micro-LED micro-display, with relatively high costs.

CN107799545A discloses a micro-display semiconductor device, which needs to use an accurate method to perform alignment laminating on a matrix substrate and an LED epitaxial substrate material. This process has high requirements for accuracy of the alignment, due to more pixel defects caused by the alignment.

CN108997425A discloses another technical route. That is, through a layer-by-layer deposition method, LED functional material layers are directly manufactured on a silicon-based driving circuit backplate layer by layer, and then the LED functional material layers are etched and an etching region is filled with an isolation material to form a plurality of independent chip structures.

SUMMARY

In order to solve the above technical problems, an objective of the present disclosure is to provide a manufacturing process for a micro-display screen with a simple process and few pixel defects.

In order to achieve the above objective, the present disclosure adopts the following technical solutions. A manufacturing process for an ultra-high-resolution micro-display screen is provided, including:
providing a driving backplate, a plurality of windows being reserved on a partial region of a side surface of the driving backplate, and metal pads being provided between the plurality of windows;
arranging an isolation column at a position of each of the windows, a plurality of isolation columns separating the driving backplate into a plurality of chip regions;
providing an LED epitaxial wafer including a substrate and a multi-layer semiconductor functional material grown on the substrate;
arranging conductive solders in the plurality of chip regions;
performing alignment-free lamination on the LED epitaxial wafer and the driving backplate; and
removing the substrate of the LED epitaxial wafer, and performing exposure and development on the LED epitaxial wafer to enable the chip regions to form a plurality of LED light-emitting structures.

In the above technical solution, further preferably, the isolation column is made of a material capable of tolerating Chemical Mechanical Polishing (CMP) and Inductively Coupled Plasma (ICP) processes.

In the above technical solution, further preferably, the isolation column is made of one of $SiO_2$, SiN, Cr and Pt or of a multilayer structure made of such materials.

In the above technical solution, further preferably, the windows are classified into a feature region corresponding to a feature pattern and an isolation region isolating the plurality of metal pads.

In the above technical solution, further preferably, said arranging conductive solders in the plurality of chip regions includes:
arranging a layer of first solder on the driving backplate after formation of the isolation column; and
removing the first solder at the top of the isolation column by using a CMP process.

In the above technical solution, further preferably, a second solder is arranged on another side surface of the LED epitaxial wafer opposite to the substrate.

In the above technical solution, further preferably, the conductive solder is a metal solder, and the alignment-free lamination is to laminate the driving backplate and the LED epitaxial wafer at a temperature less than or equal to 120 degrees Celsius.

In the above technical solution, further preferably, said performing exposure and development on the LED epitaxial wafer to enable the chip regions to form a plurality of LED light-emitting structures includes:
performing alignment exposure and development according to a window pattern on the driving backplate, and forming a V-shaped trench above each isolation column, the LED light-emitting structure being in a shape of a trapezoid, and the longest side of the LED light-emitting structure being less than a distance between two adjacent ones of the isolation columns.

In the above technical solution, further preferably, after forming the plurality of LED light-emitting structures, the plurality of LED light-emitting structures and the driving backplate are heated and pressed as a whole, so that part of the LED light-emitting structures are immersed in the solder, and part of an N-type semiconductor functional material of the LED light-emitting structure is lower than the isolation column.

In the above technical solution, further preferably, the conductive solder in the manufacturing process is a metal solder, and during the heating and pressing on the whole, the conductive solder and the metal pad are completely eutectic.

In the above technical solution, further preferably, in the manufacturing process, before the LED light-emitting structure and the driving backplate are heated and pressed as a whole, a first insulation layer is grown on the LED light-emitting structure; and after the LED light-emitting structure and the driving backplate are heated and pressed as a whole, part of the N-type semiconductor functional material is removed through a CMP process.

In the above technical solution, further preferably, after the part of the semiconductor functional material is removed, a second insulation layer is arranged, then the second insulation layer is patterned to expose the N-type semiconductor functional material, and finally a transparent conductive film covering a light exit side of the N-type semiconductor functional material is formed.

Another technical solution of the present disclosure is directed to an ultra-high-resolution micro-display screen, including:
- a driving backplate provided with a plurality of metal pads, a circuit structure being formed in the driving backplate, and the plurality of metal pads forming an electrical connection to the circuit structure;
- a plurality of LED units located on the driving backplate and forming an electrical connection to the metal pads; and
- a plurality of isolation columns arranged on the driving backplate, the isolation columns forming separations between the plurality of LED units, wherein regions between the plurality of LED units are filled with conductive solders, and the LED units are at least partially embedded into the conductive solders.

In the above technical solution, further preferably, the LED unit has a P-type semiconductor layer, a light-emitting layer and an N-type semiconductor layer, and a height of the N-type semiconductor layer is lower than that of the isolation column.

In the above technical solution, further preferably, an outer circumferential side of the LED unit and the top of the isolation column are covered by an insulation layer, and the N-type semiconductor layer is covered by a transparent conductive layer.

In the above technical solution, further preferably, a length of the longest side of the LED unit is less than or equal to a distance between two adjacent ones of the isolation columns.

In the above technical solution, further preferably, a cross-sectional area of the N-type semiconductor layer of the LED unit is less than a cross-sectional area of the light-emitting layer and less than a cross-sectional area of the P-type semiconductor layer.

In the above technical solution, further preferably, the conductive solder includes a first solder arranged on the metal pad and a second solder grown at the bottom of the LED unit.

In the above technical solution, further preferably, both the first solder and the second solder are metal solders, and the first solder, the second solder and the metal pad form a eutectic.

Compared with the prior art, the present disclosure achieves the following beneficial effects. The manufacturing method according to the present disclosure may realize alignment-free soldering of the LED. An ultra-high-resolution micro-display may be manufactured with existing mature processes, which has low technological difficulty, low costs and few pixel defects. In the micro-display screen manufactured with the manufacturing process according to the present disclosure, the LED units thereof are embedded into the conductive solder, such that a stable package for the LED units may be formed, a high soldering adhesion is achieved, and the reliability and stability of the display screen can be improved.

BRIEF DESCRIPTION OF THE DRAWINGS

FIG. 14 is a schematic diagram illustrating a partial structure of the micro-display screen according to the present disclosure.

In the drawings, 10: driving backplate; 11: metal pad; 12: mark region; 13: isolation region; 20: isolation column; 31: first solder; 32: second solder; 4: LED unit; 40: LED light-emitting structure; 41: N-type semiconductor layer; 42: light-emitting layer; 43: P-type semiconductor layer; 44: substrate; 45: LED epitaxial wafer; 51: first insulation layer; 52: second insulation layer; and 60: transparent conductive layer.

DETAILED DESCRIPTION OF THE EMBODIMENTS

In order to explain the technical content, structural features, objectives achieved and efficacy of the present disclosure in detail, the following is a detailed description with reference to embodiments and the accompanying drawings.

Figure 1:
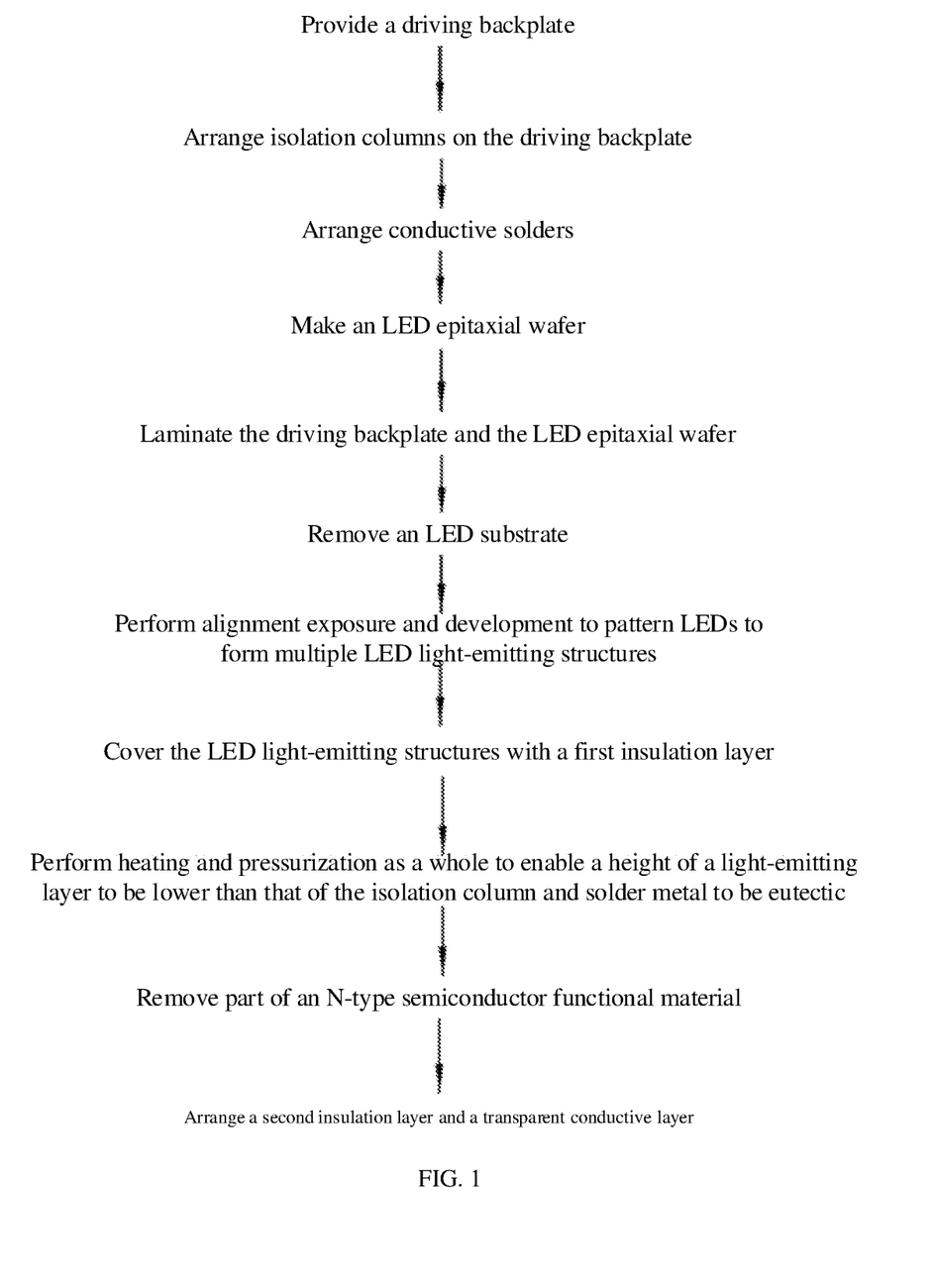
FIG. 1 is a flow diagram illustrating a manufacturing process according to the present disclosure.

This embodiment provides a manufacturing process for an ultra-high-resolution micro-display screen. FIG. 1 is a schematic diagram of a main flow of the process. FIG. 2 to FIG. 14 illustrate a process of the manufacturing process. FIG. 14 is a sectional view of a finished micro-display screen finally obtained, from which it may be seen that the micro-display screen obtained with the manufacturing process according to the present disclosure includes a driving backplate 10, a plurality of metal pads 11 arranged on the driving backplate 10, a plurality of isolation columns 20, a first solder 31 and a second solder 32 filled between the plurality of isolation columns 20, a plurality of LED units 4 embedded in conductive solders, an insulation layer 51/52 and a transparent conductive layer 60.

According to the manufacturing process of the implementation scheme of the present disclosure, a manufacturing process for a micro-display screen is as follows.

Figure 2:
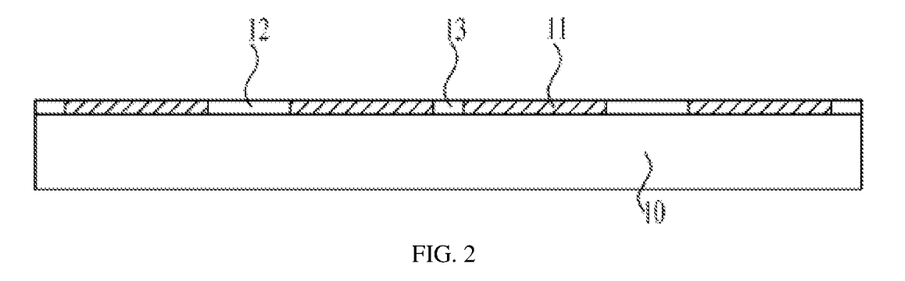
FIG. 2 to FIG. 14 are schematic diagrams illustrating partial structures of devices formed in a manufacturing process for a micro-display screen according to an embodiment of the present disclosure.

Referring to FIG. 2, a silicon-based driving backplate 10 is provided. A plurality of driving circuit structure units and a plurality of conductive electrodes are arranged inside the driving backplate 10. A partial region of an upper surface of the driving backplate 10 is covered with a plurality of metal pads 11. Each driving circuit structure unit corresponds to at least one of the metal pads. The metal pad 11 is conductively connected to the driving circuit and the conductive electrode. Remaining regions of the driving backplate 10 are further provided with a plurality of windows (12/13). A part of the windows correspond to a feature pattern (mark region 12) and another part of the windows correspond to an isolation region 13 configured to isolate the plurality of metal pads.

Figure 3:
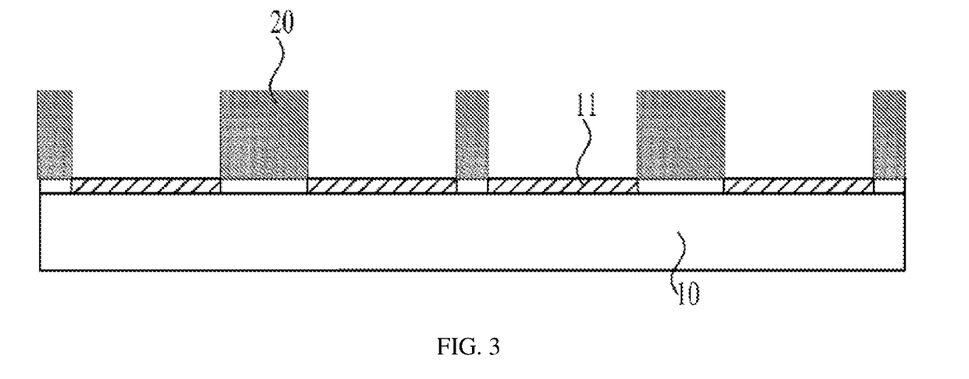

Referring to FIG. 3, isolation columns 20 are arranged in the mark region and the isolation region of the driving backplate 10 respectively. The plurality of isolation columns 20 separate the driving backplate 10 into a plurality of chip regions. The isolation column 20 may be made of $SiO_2$, SiN, Cr, Pt or other metals with high hardness, or of a multilayer structure made of the above materials. The material of the isolation column 20 is required to be capable of tolerating CMP and ICP processes. A pattern of the isolation columns in the mark region is exactly the same as a size of a mark pattern.

Figure 4:
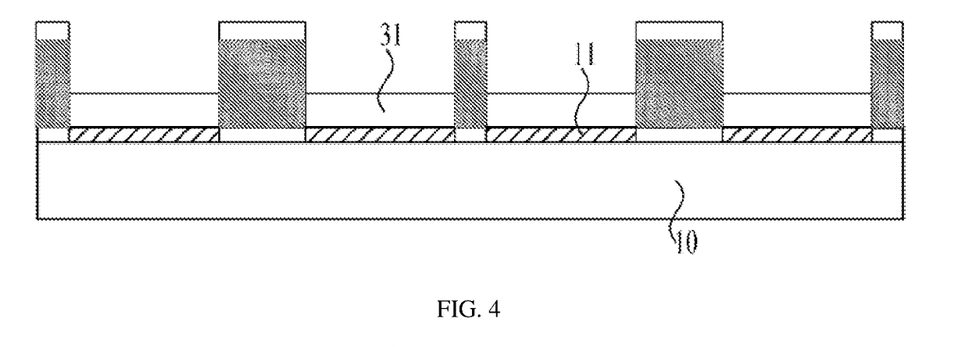

Referring to FIG. 4, a first solder 31 is arranged on the driving backplate 10. The first solder 31 is a conductive solder, preferably a metal solder, such as Sn, In or Ag.

Figure 5:
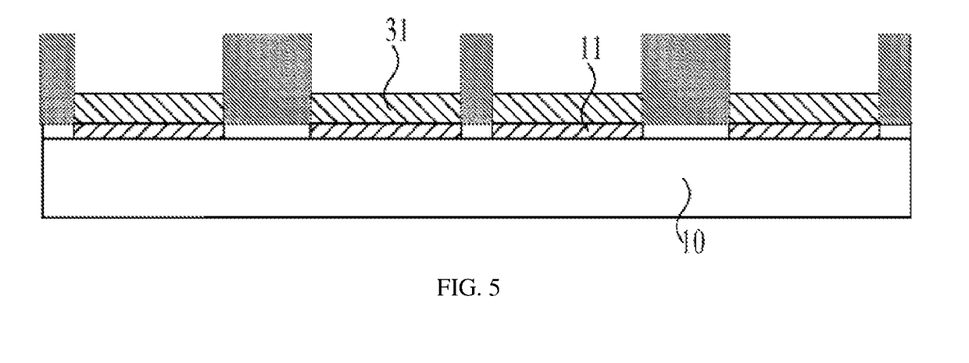

Referring to FIG. 5, the first solder 31 at the top of the isolation column is removed by using a CMP process.

Figure 6:
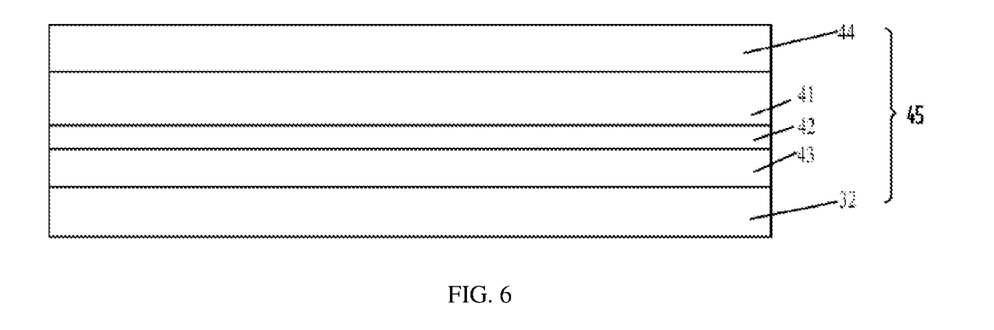

Referring to FIG. 6, an LED epitaxial wafer 45 is provided. The LED epitaxial wafer 45 includes a substrate 44 and an N-type semiconductor layer 41, a light-emitting layer 42, a P-type semiconductor layer 43 and a second solder layer 32 sequentially grown on the substrate 44. The N-type semiconductor layer is made of N—GaN. The P-type semiconductor layer is made of P—GaN. The light-emitting layer is made of MQW. The second solder 32 is also preferably a metal solder, especially preferably made of a same material as the first solder. Since the N-type semiconductor layer may be partially polished in the subsequent process, a thickness of the N-type semiconductor layer is required to be greater than that of the P-type semiconductor layer.

Figure 7:
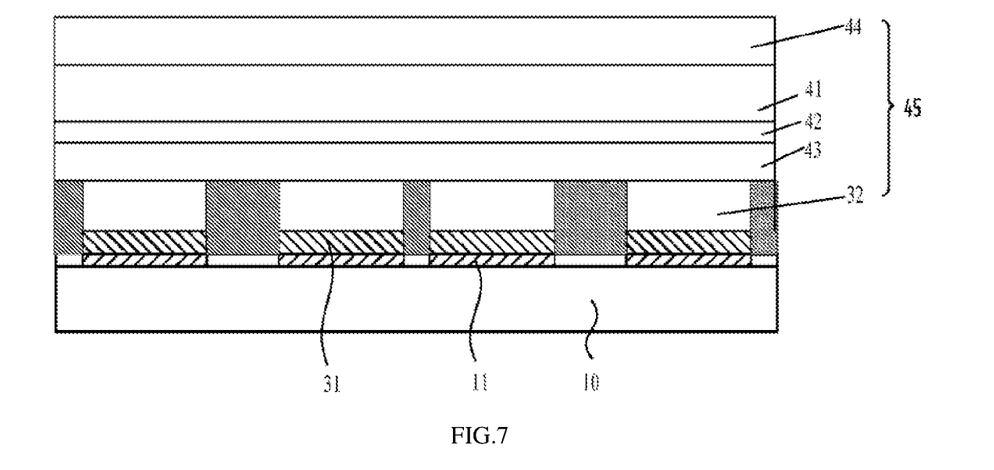

Referring to FIG. 7, alignment-free lamination is performed on the LED epitaxial wafer 45 and the driving backplate 10, so that the P-type semiconductor layer 43 is in micro contact with the isolation column 20. The lamination may be performed at room temperature, or in a heated state below 120 degrees Celsius. Since the LED epitaxial wafer 45 is laminated on the driving backplate 10 as a while, the laminating process does not require precise aiming or alignment, and has a high process tolerance and a simple implementation process.

Figure 8:
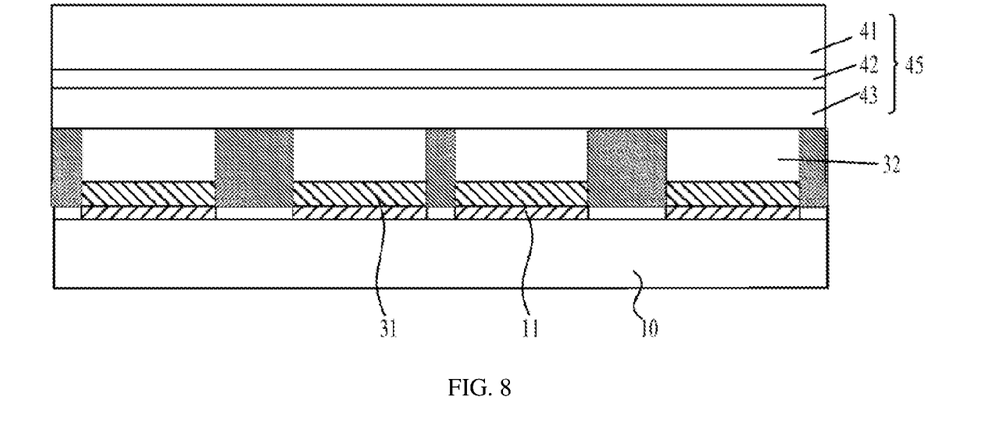
Figure 9:
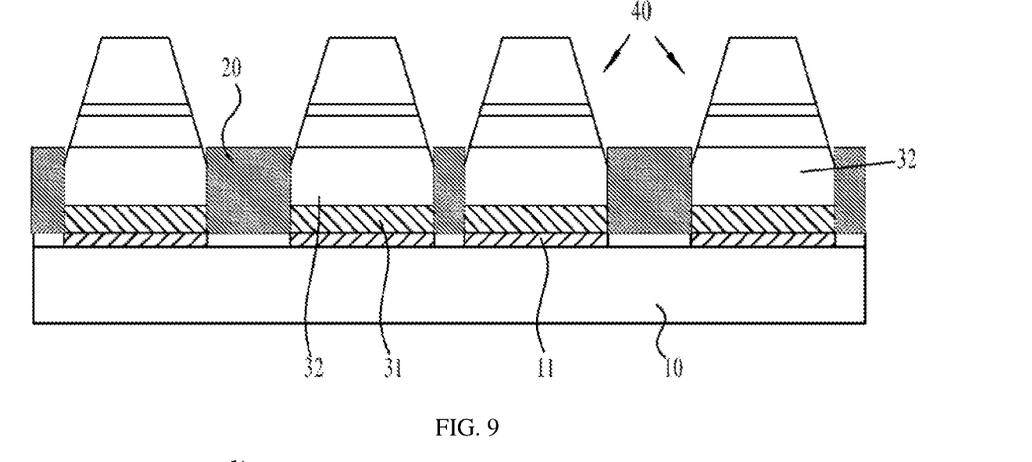

Referring to FIG. 8, the substrate 44 of the LED epitaxial wafer 45 is removed, alignment exposure and development are performed according to the mark region on the driving backplate 10, and the LED is patterned by using an ICP process. V-shaped trenches are formed above the isolation columns 20, so that the LED epitaxial wafer is divided into a plurality of trapezoidal LED light-emitting structures 40. The LED light-emitting structure includes an N-type semiconductor layer, a light-emitting layer and a P-type semiconductor layer. The LED light-emitting structure 40 completely falls within the chip region, and the longest side of the LED light-emitting structure 40 is slightly less than a distance between two adjacent ones of the isolation columns. That is, a gap between the LED light-emitting structure 40 and the isolation column 20 to allow the conductive solder to enter can be ensured.

Figure 10:
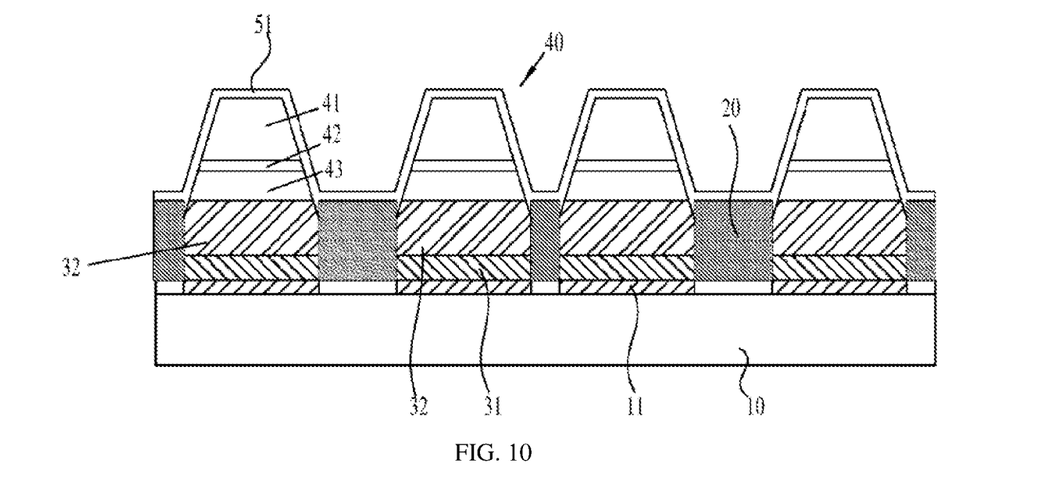

Referring to FIG. 10, a first insulation layer 51 is formed on the LED light-emitting structure 40. The first insulation layer 51 may be implemented by growing a layer of $SiO_2$ through plasma enhanced chemical vapor deposition (PECVD) or by depositing a layer of $Al_2O_3$ through atomic layer deposition (ALD).

Figure 11:
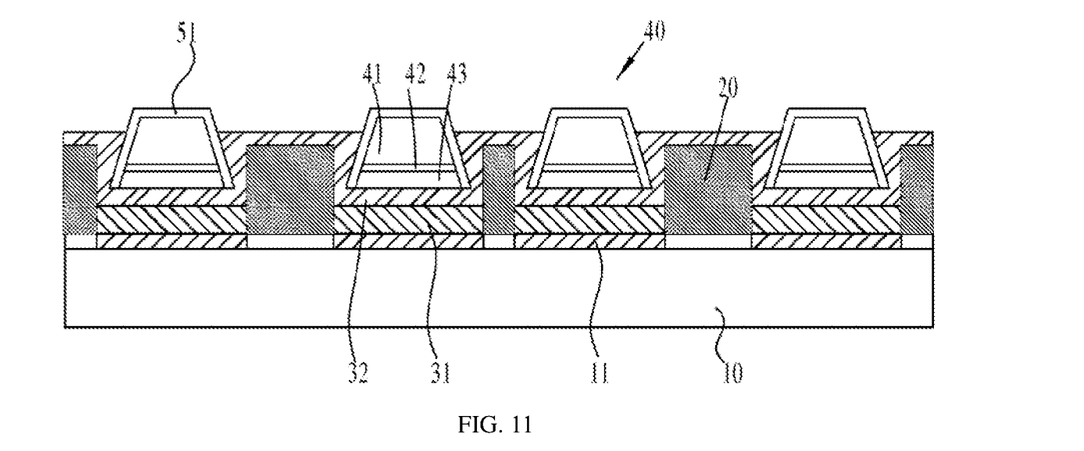

Referring to FIG. 11, the plurality of LED light-emitting structures 40 and the driving backplate 10 are heated and pressed as a whole, so that part of the LED light-emitting structures are immersed in the conductive solder, and a height of the light-emitting layer 42 of the LED light-emitting structure is ensured to be lower than that of the isolation column 20, so as to ensure that part of the N-type semiconductor layer and the light-emitting layer can be retained in the LED light-emitting structure in the subsequent polishing process. A temperature of the heating and pressing is required to be preferably controlled within a range from 150 degrees Celsius to 300 degrees Celsius, and the conductive solder and the metal pad are required to be completely eutectic during the heating and pressing. After cooling, the conductive solder and the metal pad can form a eutectic, so as to provide strong support for the LED light-emitting structure.

Figure 12:
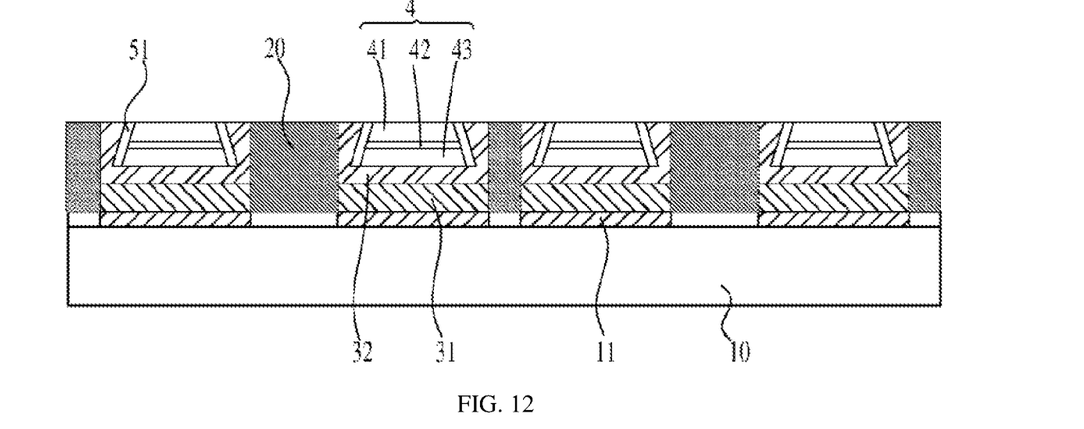

Referring to FIG. 12, after the heating and pressing on the whole, part of an N-type semiconductor functional material is removed by CMP to form an LED unit 4.

Figure 13:
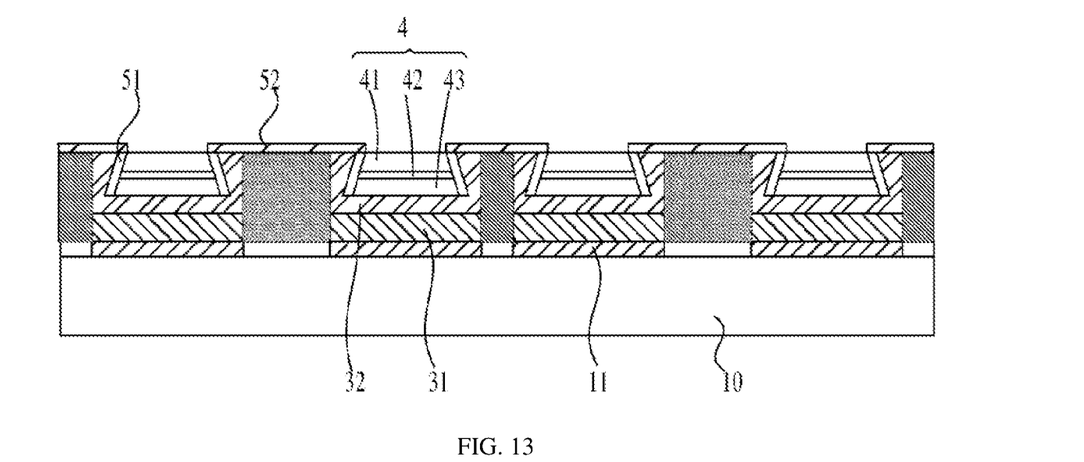
Figure 14:
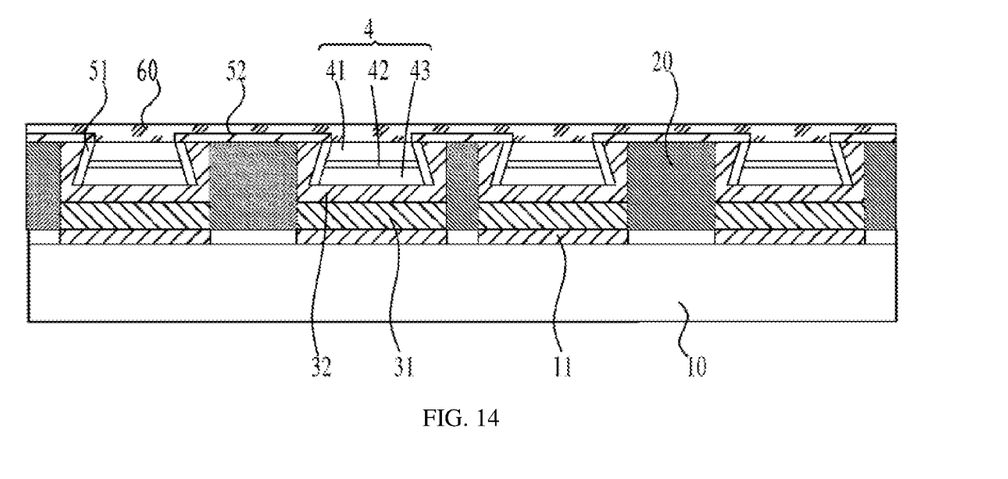

Referring to FIG. 13, a second insulation layer 52 is arranged on a surface of the driving backplate 10 and is patterned at the same time, so that the N-type semiconductor layer of the LED unit 4 is exposed, and a region outside the N-type semiconductor layer is covered with the second insulation layer 52. The second insulation layer 52 may be made of a same membrane material as or a different membrane material than the first insulation layer 51.

Referring to FIG. 14, finally, a transparent conductive layer (or transparent conductive film) 60 covering a light exit side of the N-type semiconductor functional material is formed on the second insulation layer 52. The transparent conductive layer 60 may be made of ITO, ZnO or a patterned metal material.

FIG. 14 is a schematic diagram illustrating a partial structure of a micro-display screen according to an implementation scheme of the present disclosure. The micro-display screen may extend in two directions in the form of an array in a two-dimensional plane to form an LED micro-display screen of a certain size. Referring to FIG. 14, the micro-display screen includes a driving backplate 10, a plurality of isolation columns 20, a plurality of LED units 4 and conductive solders.

A circuit structure, a metal electrode and the like are formed in the driving backplate 10. A plurality of metal pads 11 are arranged on an upper surface of the driving backplate 10. The metal pads 11 form an electrical connection to the circuit structure.

The plurality of isolation columns 20 are patterned on the driving backplate, and the plurality of isolation columns divide the driving backplate into a plurality of regions. A chip region for placing an LED is formed between two isolation columns.

Each of the plurality of LED units 4 includes a P-type semiconductor layer 43 in conductive contact with the second solder, a light-emitting layer 42 arranged above the P-type semiconductor layer 43, and an N-type semiconductor layer 41 arranged above the light-emitting layer 42. The LED units 4 are located in a plurality of chip regions on the driving backplate 10 respectively, and the P-type semiconductor layer 43 forms an electrical connection to the metal pad 11. A cross-sectional area of the P-type semiconductor layer 43 is greater than that of the light-emitting layer 42, and the cross-sectional area of the light-emitting layer 42 is greater than that of the N-type semiconductor layer 41, to form a trapezoidal structure with narrow top and wide bottom. A size of the P-type semiconductor layer 43 of the LED unit is less than or equal to that of the metal pad 11. That is, the longest side of the LED unit is required to be less than a distance between two adjacent ones of the isolation columns 20, so that a gap to allow the solder to enter can be formed between the LED unit and the isolation column.

The conductive solders are filled in the chip regions to form a dovetail groove structure. The plurality of LED units 4 are embedded into the conductive solders. That is, the conductive solders are wrapped around outer sides of the LED units to provide a stable support, which improves soldering adhesion, and in the subsequent application process, can ensure a good contact between the LED units and the driving backplate all the time without welding off or falling off.

The driving backplate 10 is a silicon-based driving backplate, which, in addition, may also be made of a glass material. The circuit structure in the driving backplate 10 includes a driving circuit, a control circuit, an electrode and so on. Referring to FIG. 2, a plurality of metal pads 11 and windows are pre-arranged on a surface of the driving backplate 10. The plurality of isolation columns is arranged in the windows in advance, prior to wafer bonding. Then the LED epitaxial wafer is bonded on the driving backplate by performing alignment-free lamination on the LED epitaxial wafer as a whole.

The conductive solder includes a first solder 31 arranged on the metal pad 11 and a second solder 32 arranged at the bottom of the LED unit. Preferably, both the first solder 31 and the second solder 32 are metal solders and preferably a same solder. After forming the plurality of LED light-emitting structures 40, when the LED light-emitting structure and the driving backplate are laminated as a whole, the conductive solder and the metal pad may be completely eutectic when heated. In this way, after cooling, the conductive solder may form a eutectic with the metal pad, so that the LED unit is wrapped by a metal eutectic, which improves soldering adhesion and enables the micro-display screen to have more stable properties during the subsequent use or manufacturing process.

In addition, in order to ensure that the LED unit can still retain enough N-type semiconductor functional materials in the second CMP process, the height of part of the N-type semiconductor layers 41 and the height of all the light-emitting layers 42 are required to be lower than the height of the isolation column 20 when the LED light-emitting structures are heated and pressed as a whole.

An outer circumferential side of the LED unit 4 and the top of the isolation column are covered by insulation layers including a first insulation layer 51 covering a circumferential surface of the LED unit 4 and a second insulation layer 52 covering the top of the isolation column 20. An upper surface of the N-type semiconductor layer 41 is exposed and is in conductive contact with a transparent conductive layer 60 or a non-transparent conductive grid layer. The transparent conductive layer 60 is configured to connect a cathode electrode of the driving backplate.

The above shows and describes basic principles of the present disclosure, main features and advantages of the present disclosure. Those skilled in the art should understand that the present disclosure is not limited to the above embodiments and the above embodiments and specifications are only described to illustrate the principles of the present disclosure. The present disclosure may also have various changes and improvements without departing from the spirit and scope of the present disclosure, and the protection scope of the present disclosure is defined by the appended claims, the specification and equivalents thereof.

What is claimed is:

1. A manufacturing process for an ultra-high-resolution micro-display screen, the manufacturing process comprising:
    providing a driving backplate, a plurality of windows being reserved on a partial region of a side surface of the driving backplate, and metal pads being provided between the plurality of windows;
    arranging an isolation column at a position of each of the windows, a plurality of isolation columns separating the driving backplate into a plurality of chip regions;
    providing an LED epitaxial wafer including a substrate and a multi-layer semiconductor functional material grown on the substrate;
    arranging conductive solders in the plurality of chip regions;
    performing alignment-free lamination on the LED epitaxial wafer and the driving backplate; and
    removing the substrate of the LED epitaxial wafer, and performing exposure and development on the LED epitaxial wafer to enable the chip regions to form a plurality of LED light-emitting structures.

2. The manufacturing process according to claim 1, wherein the isolation column is made of a material capable of tolerating chemical mechanical polishing (CMP) and inductively coupled plasma (ICP) processes.

3. The manufacturing process according to claim 2, wherein the isolation column is made of one of $SiO_2$, SiN, Cr, Pt, or of a multilayer structure made of such materials.

4. The manufacturing process according to claim 1, wherein the windows are classified into a feature region corresponding to a feature pattern and an isolation region isolating the plurality of metal pads.

5. The manufacturing process according to claim 1, wherein said arranging conductive solders in the plurality of chip regions includes:
    arranging a layer of first solder on the driving backplate after formation of the isolation column; and
    removing the first solder at the top of the isolation column by using a CMP process.

6. The manufacturing process according to claim 5, wherein a second solder is arranged on another side surface of the LED epitaxial wafer opposite to the substrate.

7. The manufacturing process according to claim 1, wherein the conductive solder is a metal solder, and the alignment-free lamination is to laminate the driving backplate and the LED epitaxial wafer at a temperature less than or equal to 120 degrees Celsius.

8. The manufacturing process according to claim 1, wherein said performing exposure and development on the LED epitaxial wafer to enable the chip regions to form a plurality of LED light-emitting structures includes:
    performing alignment exposure and development according to a window pattern on the driving backplate, and forming a V-shaped trench above each isolation column, the LED light-emitting structure being in a shape of a trapezoid, and the longest side of the LED light-emitting structure being less than a distance between two adjacent ones of the isolation columns.

9. The manufacturing process according to claim 1, wherein after forming the plurality of LED light-emitting structures, the plurality of LED light-emitting structures and the driving backplate are heated and pressed as a whole, so that part of the LED light-emitting structures are immersed in the solder, and part of an N-type semiconductor functional material of the LED light-emitting structure is lower than the isolation column.

10. The manufacturing process according to claim 9, wherein the conductive solder is a metal solder, and during the heating and pressing on the whole, the conductive solder and the metal pad are completely eutectic.

11. The manufacturing process according to claim 9, wherein before the LED light-emitting structure and the driving backplate are heated and pressed as a whole, a first insulation layer is grown on the LED light-emitting structure; and after the LED light-emitting structure and the driving backplate are heated and pressed as a whole, part of the N-type semiconductor functional material is removed through a CMP process.

12. The manufacturing process according to claim 11, wherein after the part of the semiconductor functional material is removed, a second insulation layer is arranged, then the second insulation layer is patterned to expose the N-type semiconductor functional material, and finally a transparent conductive film covering a light exit side of the N-type semiconductor functional material is formed.

13. An ultra-high-resolution micro-display screen, comprising:
 a driving backplate provided with a plurality of metal pads, a circuit structure being formed in the driving backplate, and the plurality of metal pads forming an electrical connection to the circuit structure;
 a plurality of LED units located on the driving backplate and forming an electrical connection to the metal pads; and
 a plurality of isolation columns arranged on the driving backplate, the isolation columns forming separations between the plurality of LED units, wherein regions between the plurality of LED units are filled with conductive solders, and the LED units are at least partially embedded into the conductive solders.

14. The ultra-high-resolution micro-display screen according to claim 13, wherein the LED unit has a P-type semiconductor layer, a light-emitting layer and an N-type semiconductor layer, and a height of the N-type semiconductor layer is lower than that of the isolation column.

15. The ultra-high-resolution micro-display screen according to claim 14, wherein an outer circumferential side of the LED unit and the top of the isolation column are covered by an insulation layer, and the N-type semiconductor layer is covered by a transparent conductive layer.

16. The ultra-high-resolution micro-display screen according to claim 13, wherein a length of the longest side of the LED unit is less than or equal to a distance between two adjacent ones of the isolation columns.

17. The ultra-high-resolution micro-display screen according to claim 16, wherein a cross-sectional area of the N-type semiconductor layer of the LED unit is less than a cross-sectional area of the light-emitting layer and less than a cross-sectional area of the P-type semiconductor layer.

18. The ultra-high-resolution micro-display screen according to claim 13, wherein the conductive solder includes a first solder arranged on the metal pad and a second solder grown at the bottom of the LED unit.

19. The ultra-high-resolution micro-display screen according to claim 18, wherein both the first solder and the second solder are metal solders, and the first solder, the second solder and the metal pad form a eutectic.

\* \* \* \* \*